(12) United States Patent
Naito et al.

(10) Patent No.: US 8,496,350 B2
(45) Date of Patent: Jul. 30, 2013

(54) WIRING BOARD CONTRIBUTABLE TO REDUCTION IN THICKNESS OF LIGHT EMITTING APPARATUS AND HAVING HIGH VERSATILITY

(75) Inventors: Takeharu Naito, Tokyo (JP); Kazuaki Ibaraki, Tokyo (JP); Nobukazu Kato, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 662 days.

(21) Appl. No.: 12/658,502

(22) Filed: Feb. 11, 2010

(65) Prior Publication Data
US 2010/0226126 A1 Sep. 9, 2010

(30) Foreign Application Priority Data
Mar. 6, 2009 (JP) ................................. 2009-053677

(51) Int. Cl.
*F21S 4/00* (2006.01)
*F21V 21/00* (2006.01)

(52) U.S. Cl.
USPC ............ 362/249.04; 262/249.01; 262/249.02; 262/249.03; 262/249.06; 262/249.08

(58) Field of Classification Search
USPC ............ 362/249.01, 249.02, 249.03, 249.04, 362/249.06, 249.08
See application file for complete search history.

(56) References Cited

U.S. PATENT DOCUMENTS

| | | | |
|---|---|---|---|
| 2005/0180162 A1* | 8/2005 | Fan | 362/555 |
| 2005/0213321 A1* | 9/2005 | Lin | 362/231 |
| 2005/0239342 A1* | 10/2005 | Moriyama et al. | 439/699.2 |
| 2007/0147009 A1 | 6/2007 | Morelle et al. | |
| 2008/0205059 A1 | 8/2008 | Tsuji et al. | |
| 2009/0268434 A1* | 10/2009 | Mita et al. | 362/97.1 |

FOREIGN PATENT DOCUMENTS

| | | |
|---|---|---|
| JP | 2004-179481 | 6/2004 |
| JP | 2005-159260 | 6/2005 |
| JP | 2007-535801 | 12/2007 |
| JP | 2008-218013 | 9/2008 |

* cited by examiner

*Primary Examiner* — Anh T. Mai
*Assistant Examiner* — Kevin Quaterman
(74) *Attorney, Agent, or Firm* — Collard & Roe, P.C.

(57) ABSTRACT

The wiring board comprises an FFC and a through-hole portion as a segmenting portion. The through-hole portion segments the conductive pattern of the FFC into a plurality of conductive pattern segments. The conductive pattern segments connect the light emitting elements to thereby connect the light emitting elements in series to one another.

9 Claims, 9 Drawing Sheets

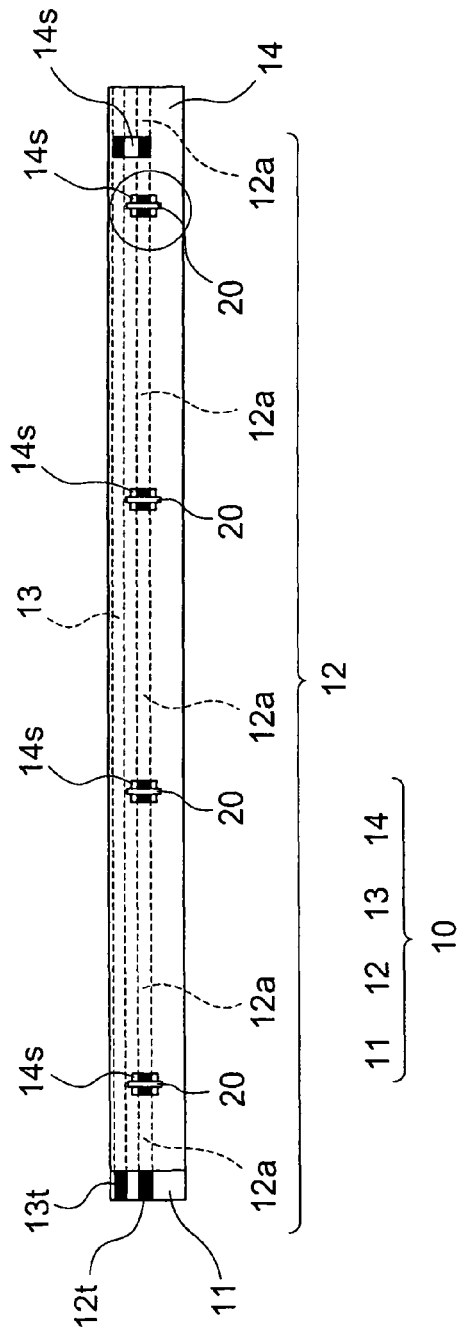
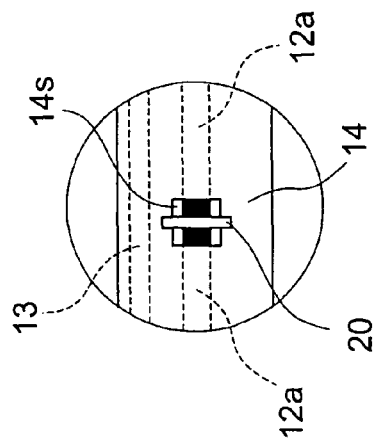
FIG. 1A
FIG. 1B

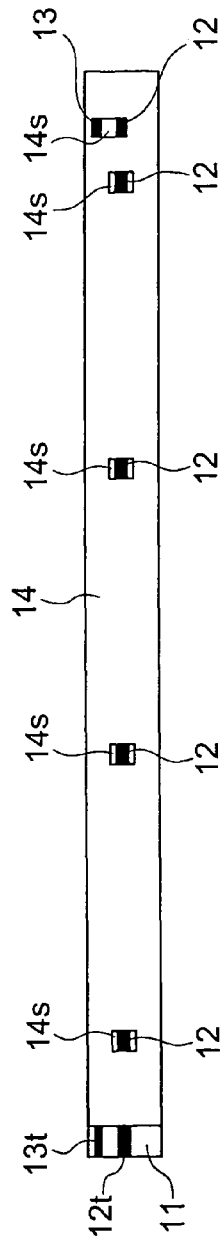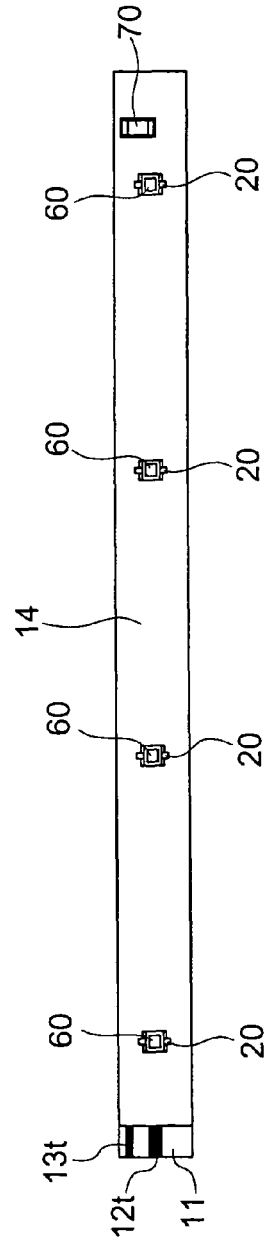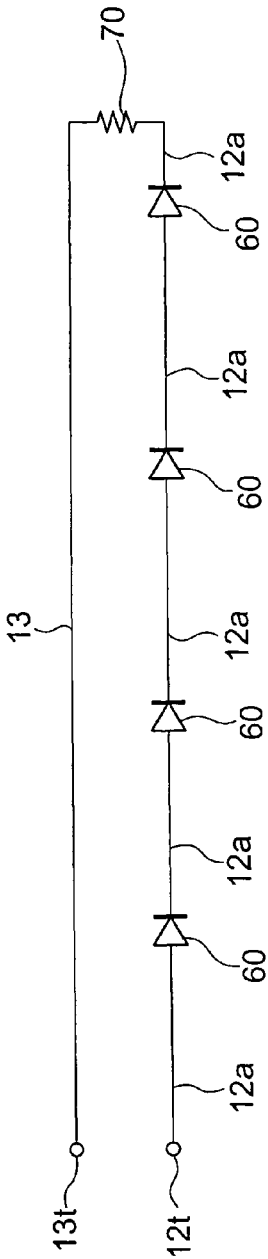

WIRING BOARD CONTRIBUTABLE TO REDUCTION IN THICKNESS OF LIGHT EMITTING APPARATUS AND HAVING HIGH VERSATILITY

This application is based upon and claims the benefit of priority from Japanese patent application No. 2009-53677, filed on Mar. 6, 2009, the disclosure of which is incorporated herein in its entirety by reference.

BACKGROUND OF THE INVENTION

This invention relates to wiring means for electrically connecting a plurality of light emitting elements and, in particular, to a wiring board which has an FFC (Flexible Flat Cable) and to a light emitting apparatus which has the wiring board and the light emitting elements mentioned above.

In recent lighting means, in order to realize reduction in size and in weight, electric power saving, improvement in durability and maintainability, reduction in cost, precise control of color tones and luminances, and the like, conventional light emitting means is progressively replaced by a solid-state light emitting element. The conventional light emitting means is, for example, a kind of a vacuum tube, such as an electric bulb and a cold-cathode tube. The solid-state light emitting element is, for example, a LED (Light Emitting Diode) or the like.

As a specific example, a backlight of a liquid crystal display will be considered. For a small-sized display, the LED or EL (Electro Luminescence) has been used for a relatively long time. On the other hand, for a large-sized display, instead of the conventional light emitting apparatus using the cold-cathode tube, an array of a plurality of light emitting apparatuses each of which comprises a plurality of LEDs arranged in an array or in a line has recently become widely used.

Herein, the light emitting apparatus comprising the light emitting elements arranged in a line or in an array has, in addition to the light emitting elements, such as the LEDs, wiring means for electrically connecting the light emitting elements to one another in series or in parallel for the purpose of collectively connecting the light emitting elements to a power source or to a light emission control circuit.

As the wiring means of the light emitting apparatus comprising the light emitting elements arranged in an array, use is made of a printed board provided with a conductive pattern for connecting the light emitting elements to one another.

As the wiring means of the light emitting apparatus comprising the light emitting elements arranged in a line, for example, JP-A-2008-218013 (Document 1) discloses a wiring cable used in a ribbon-like light emitting apparatus for use in an illumination system extended indoors or outdoors. The wiring cable is a kind of a flat harness comprising a plurality of conductive wires parallel to one another and covered with a single sheath or coating. The wiring cable has a plurality of pairs of cutouts formed on lateral sides thereof at a plurality of positions. Then, a plurality of LED modules each of which is integrally formed with a resin holder having a pair of protrusions are fixed to the wiring cable so that the protrusions are fitted to the cutouts.

However, the wiring means using the printed board is required to be designed and manufactured individually for each size of a liquid crystal display. Therefore, the wiring means is low in versatility and disadvantageous in cost performance.

On the other hand, the wiring cable disclosed in Document 1 is assumed to be used in the ribbon-like light emitting apparatus which is changed into various shapes when used. Therefore, the wiring cable is not suitable for a light emitting apparatus which must be manufactured with precise dimensions and be stationarily or fixedly installed, like the backlight of the electronic device such as the liquid crystal display. Additionally, a total thickness of the harness and the resin holder of the LED module becomes a bottleneck in reduction in profile of the liquid crystal display, which is increasingly demanded in recent years.

DISCLOSURE OF THE INVENTION

It is therefore an object of the present invention to provide a wiring board which contributes to reduction in thickness of a light emitting apparatus and has high versatility and which connects a plurality of light emitting elements to one another.

It is another object of the present invention to provide a light emitting apparatus which has the above-mentioned wiring board.

According to this invention, there is provided a wiring board electrically connecting a plurality of light emitting elements to one another. The wiring board comprises an FFC (Flexible Flat Cable) provided with an insulating base film and a conductive pattern formed on the insulating base film and a segmenting portion segmenting the conductive pattern of the FFC into a plurality of conductive pattern segments. The conductive pattern segments connect the light emitting elements to thereby connect the light emitting elements in series to one another.

The conductive pattern may include a pair of a first pattern element and a second pattern element extending in parallel with each other. Each of the first and the second pattern elements has one or more segmenting portions. The segmenting portions on the first pattern element and the second pattern element are alternately arranged. Each of the conductive pattern segments of the first pattern element and each of the conductive pattern segments of the second pattern element alternately connecting the light emitting elements to thereby connect the light emitting elements in series to one another.

The FFC may further comprise an insulating cover film faced to the insulating base film with the conductive pattern sandwiched therebetween. The segmenting portion is formed in the conductive pattern and in at least one of the insulating base film and the insulating cover film. The insulating cover film has cutout portions formed in correspondence to positions where the conductive pattern and the light emitting elements are to be electrically connected to each other, so that the conductive patterns are exposed at the positions.

The FFC may further comprise a second conductive pattern formed in parallel with the conductive pattern as a first conductive pattern. The first and the second conductive patterns are connected to each other by a conductive member at one end of the FFC, so that the first and the second conductive patterns at the other end of the FFC function as a pair of power feeding lands which supply a power to the light emitting elements connected in series to one another.

The wiring board may further comprise an end reinforcing plate which is attached to a rear surface of the insulating base film at the other end of the FFC and which reinforces the power feeding lands. The other end of the FFC functions as a power feeding lead which is inserted into and pulled out from an FFC connector.

Each of the light emitting elements may have a pair of power feeding terminals formed on a bottom surface thereof and a heat-dissipating metal member formed between the power feeding terminals. The conductive pattern segments of the first pattern element or the conductive pattern segments of the second pattern element are joined by soldering to one of the power feeding terminals and to the heat-dissipating metal member.

The wiring board may further comprise a reinforcing frame which is attached to a rear surface of the insulating base film of the FFC in a region at least including positions where the light emitting elements are to be mounted, and which reinforces the FFC.

At least a front surface of the insulating cover film may reflect light emitted from the light emitting elements.

The insulating base film may transmit laser light for laser welding.

According to this invention, there is further provided a light emitting apparatus comprising the wiring board and the light emitting elements connected in series to one another by the wiring board.

The light emitting apparatus may comprise a plurality of the wiring boards arranged in parallel to one another and the light emitting elements connected in series to one another by each of the wiring boards.

BRIEF DESCRIPTION OF THE DRAWING

FIG. 1A is a plan view of a wiring board according to a first embodiment of the present invention;

FIG. 1B is an enlarged plan view showing a through-hole portion of the wiring board;

FIG. 1D is a plan view of the FFC;

FIG. 1E is a plan view of a light emitting apparatus comprising light emitting elements mounted on the wiring board;

FIG. 1F is an equivalent circuit diagram of the light emitting apparatus;

DESCRIPTION OF THE EXEMPLARY EMBODIMENTS

Figure 1C:
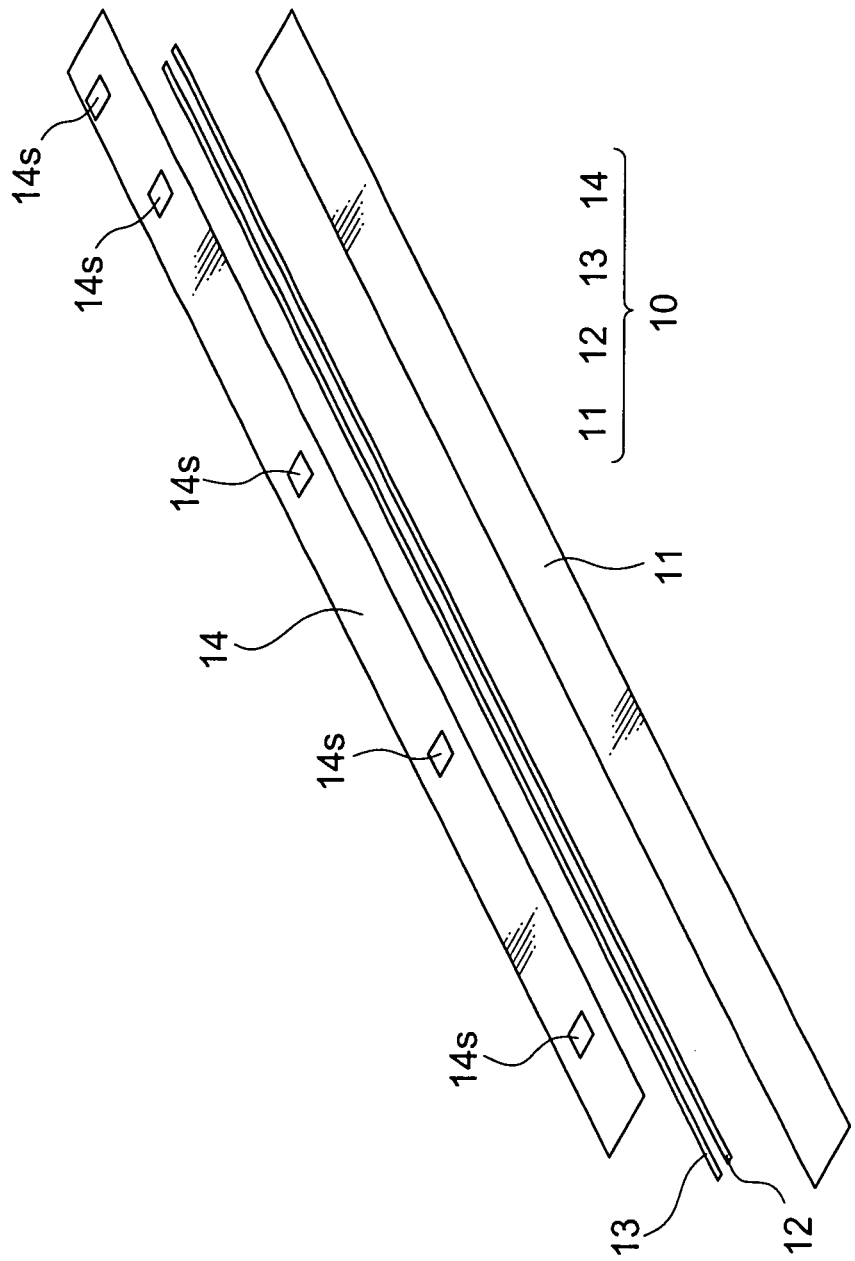
FIG. 1C is a perspective view for describing a structure of an FFC of the wiring board.

A wiring board according to the present invention, which connects a plurality of light emitting elements to one another, is a kind of wiring means which electrically connects the light emitting elements to one another.

Specifically, the wiring board according to the present invention comprises an FFC (Flexible Flat Cable) having an insulating base film and a conductive pattern formed on the insulating base film, and a segmenting portion which segments the conductive pattern of the FFC into a plurality of conductive pattern segments. Each of the conductive pattern segments connects the light emitting elements to one another, so that the light emitting elements are connected in series to one another.

The FFC has a thickness which is as extremely thin as several tens μm. Therefore, a light emitting apparatus having the wiring board has a height which can be reduced to nearly a height of the light emitting element, as compared to a case where a cable having a conductive wire is used as a conductor.

Further, as a conductor which connects the light emitting elements to one another, use is made of the conductive pattern which the FFC essentially has and which is segmented by punching. Accordingly, it is not necessary to etch a printed board into a specific pattern or to press-work a metal plate into a specific pattern in order to connect the light emitting elements to one another. Therefore, it is possible to use a standardized general-purpose FFC which is cut into a predetermined length. Thus, versatility is high.

Hereinbelow, more specific embodiments of the wiring board according to the present invention will be described in detail with reference to the drawing.

First Embodiment

Referring to FIGS. 1A to 1F, the wiring board according to a first embodiment of the present invention is adapted to electrically connect four LED chips 60 (FIGS. 1E and 1F) as a plurality of light emitting elements to one another. Each of the LED chips 60 has an anode terminal and a cathode terminal formed on a bottom surface thereof. It is noted here that the number of the LED chips is not limited to four in the present invention.

The wiring board has an FFC 10 and four segmenting portions (hereinbelow, called "through-hole portions") 20.

As is clearly seen from FIGS. 1C and 1D, the FFC 10 is a standardized general-purpose product and comprises an insulating base film 11, a first conductive pattern 12, a second conductive pattern 13, and an insulating cover film 14.

The first conductive pattern 12 is formed on a front surface of the insulating base film 11 to linearly extend. The second conductive pattern 13 is formed on the insulating base film 11 in parallel with the first conductive pattern 12. The insulating cover film 14 covers the front surface of the insulating base film 11 with the first and the second conductive patterns 12 and 13 sandwiched therebetween.

The insulating cover film 14 has cutout portions 14s formed in correspondence to positions where electrical connection to the first and the second conductive patterns 12 and 13 must be established, so that the conductive patterns 12 and 13 are exposed at these positions. In the present embodiment, the cutout portions 14s are formed at connecting positions (four positions) of the LED chips 60 and a connecting position (one position) of a resistor chip 70 which will later be described. The FFC 10 has power feeding lands 12t and 13t formed at an end portion thereof, which will later be described. The feeding lands 12t and 13t are not covered with the insulating cover film 14. Therefore, it may be understood that a cutout portion is also formed in an end region of the FFC 10. The power feeding lands 12t and 13t are positions where a power supply line from a LED driving circuit (power supply circuit) which is not shown in the figure is electrically connected to the first conductive pattern 12 and the second conductive pattern 13, respectively.

As is clearly seen from FIGS. 1A and 1B, the through-hole portions 20 are formed by punching out the first conductive pattern 12 of the FFC 10 together with the insulating base film 11 and the insulating cover film 14. The through-hole portions 20 segment the first conductive pattern 12 into a plurality of conductive pattern segments 12a. In the wiring board according to the present invention, the conductive pattern segments 12a connect the four LED chips 60 (FIGS. 1E and 1F) to one another. Thus, the LED chips 60 are connected in series to one another.

The through-hole portions 20 are formed by punching using a press in the present invention but may be formed by laser machining or the like. Furthermore, the through-hole portions 20 may not penetrate through the insulating base film 11. In other words, it is only necessary to segment the conductive pattern so as to form the conductive pattern segments 12a.

Near one end (on a right side in FIG. 1E) of the FFC 10, the resistor chip 70 as a conductive member is connected between the first and the second conductive patterns 12 and 13. Consequently, at the other end (at a left end in FIG. 1E) of the FFC 10, the first and the second conductive patterns 12 and 13 function as the power feeding lands 12t and 13t, respectively, for supplying an electric power to the LED chips 60 connected in series to one another. In the present embodiment, the power feeding land 12t is connected to the power supply line from the LED driving circuit (power supply circuit) which is not shown in the figure, while the power feeding land 13t is connected to a ground line from the LED driving circuit.

At least a front surface of the insulating cover film 14 is adapted to reflect light emitted by the LED chips 60, especially, light spreading around the chips. Specifically, the insulating cover film 14 is a white film. However, not being limited thereto, the insulating cover film 14 may be a film painted white or silver at least on a surface thereof. In case where the LED chip 60 and the resistor chip 70 are laser-welded, the insulating base film 11 is adapted to transmit laser light for laser welding for the purpose of irradiating the laser light from a rear surface of the FFC 10. Specifically, as the insulating base film 11, for example, a transparent film is used. Further, in case where the LED chips 60 and the resistor chip 70 are mounted by a reflow process, the insulating base film 11 and the insulating cover film 14 are formed of a material resistant against a high temperature in a reflow furnace.

On the above-mentioned wiring board, the four LED chips 60 and the one resistor chip 70 are mounted. Thus, a light emitting apparatus of a line arrangement is formed.

In the present embodiment, the wiring board has a length sufficient to mount the four LED chips 60. However, in the present invention, the wiring board may have any desired length. Specifically, a standardized FFC wound around a reel can be cut out into a length corresponding to the number of the light emitting elements to be mounted. Thus, it is possible to design the number of the LED chips and an interval between the LED chips as desired.

Further, by arranging a plurality of light emitting apparatuses of a line arrangement mentioned above in parallel to one another, a light emitting apparatus comprising the light emitting elements arranged in an array is obtained. Such a light emitting apparatus is used, for example, as the backlight of the liquid crystal display. Although the FFC having linearly extending conductors is used in the present embodiment, the present invention is not limited thereto. For example, if an FFC having conductors extending in a curved shape is used, light emitting apparatuses of various shapes can be realized.

Second Embodiment

A second embodiment of the present invention is different from the first embodiment in that a conductive pattern (first conductive pattern) includes a pair of a first pattern element and a second pattern element. Accordingly, components identical or similar to those in the first embodiment are designated by same or like reference numerals in the figure and detailed description thereof will be omitted.

Referring to FIGS. 2A to 2D and FIG. 3, in a wiring board according to the second embodiment of the present invention, the first conductive pattern 12' includes the first pattern element 121 and the second pattern element 122 extending in parallel with each other to form a pair.

Each of the first pattern element 121 and the second pattern element 122 is provided with one or more segmenting portions (hereinbelow, called "through-hole portions") 21 and 22. The through-hole portions 21 and 22 on the first pattern element 121 and the second pattern element 122 are alternately arranged. In the present embodiment, one through-hole portion 21 and two through-hole portions 22 are formed.

A plurality of conductive pattern segments 121a of the first pattern element 121 and a plurality of conductive pattern segments 122a of the second pattern element 122 alternately connect the LED chips 60 to one another. Consequently, the LED chips 60 are connected in series to one another.

Figure 2A:
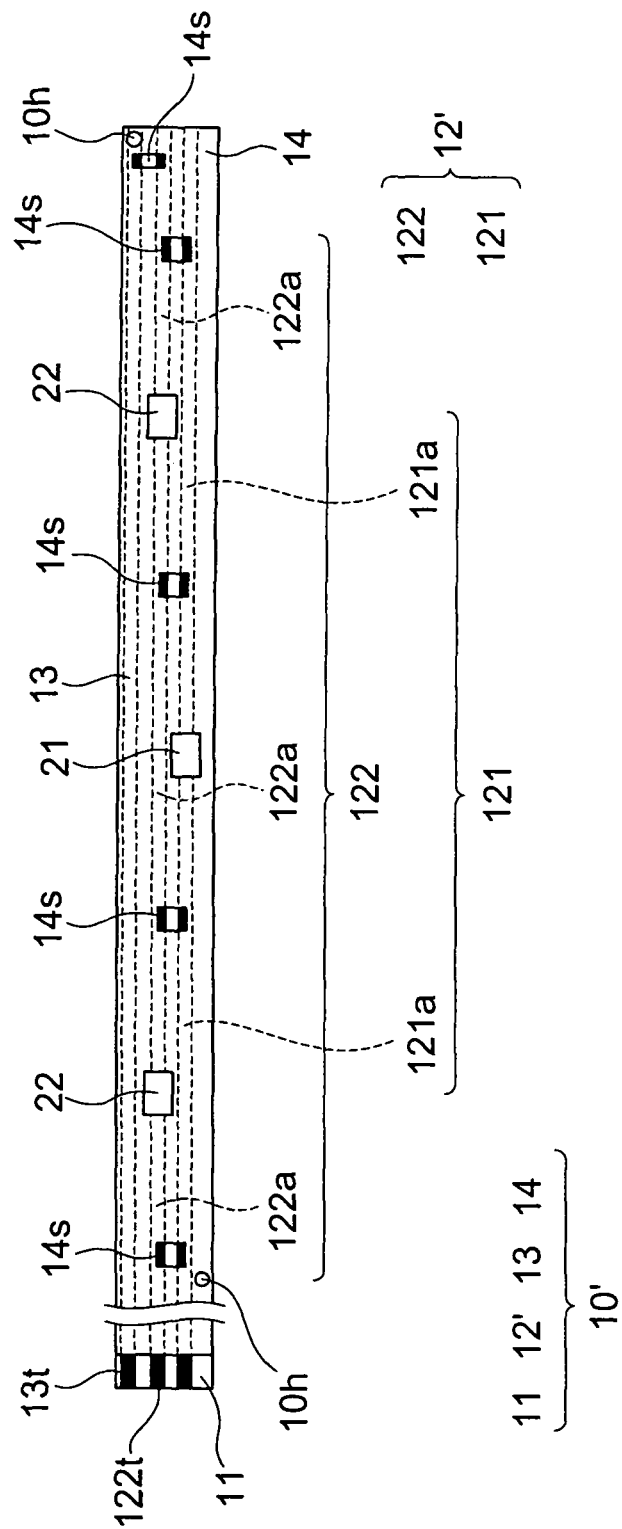
FIG. 2A is a plan view of a wiring board according to a second embodiment of the present invention.
Figure 2B:
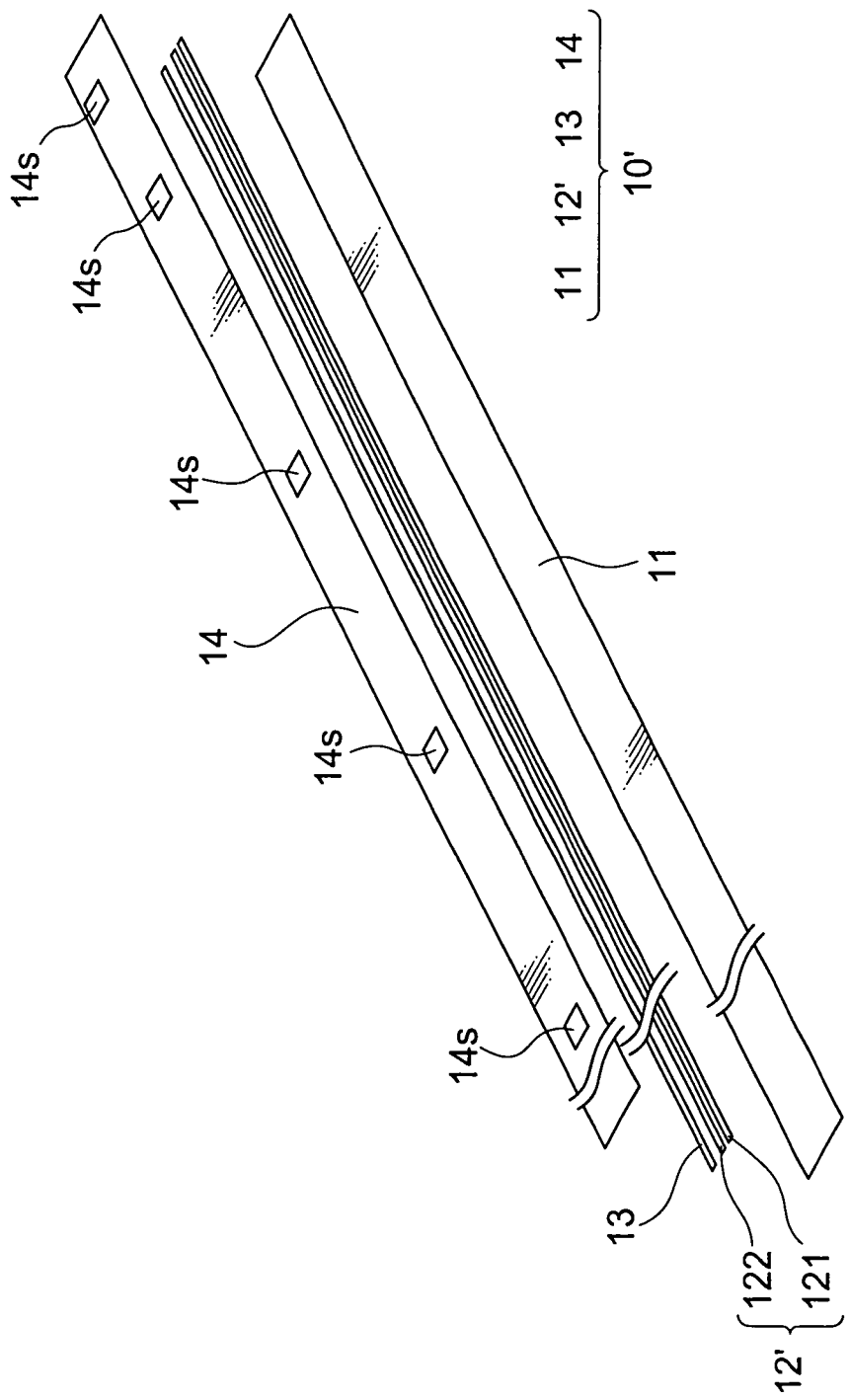
FIG. 2B is a perspective view for describing a structure of an FFC of the wiring board.
Figure 2C:
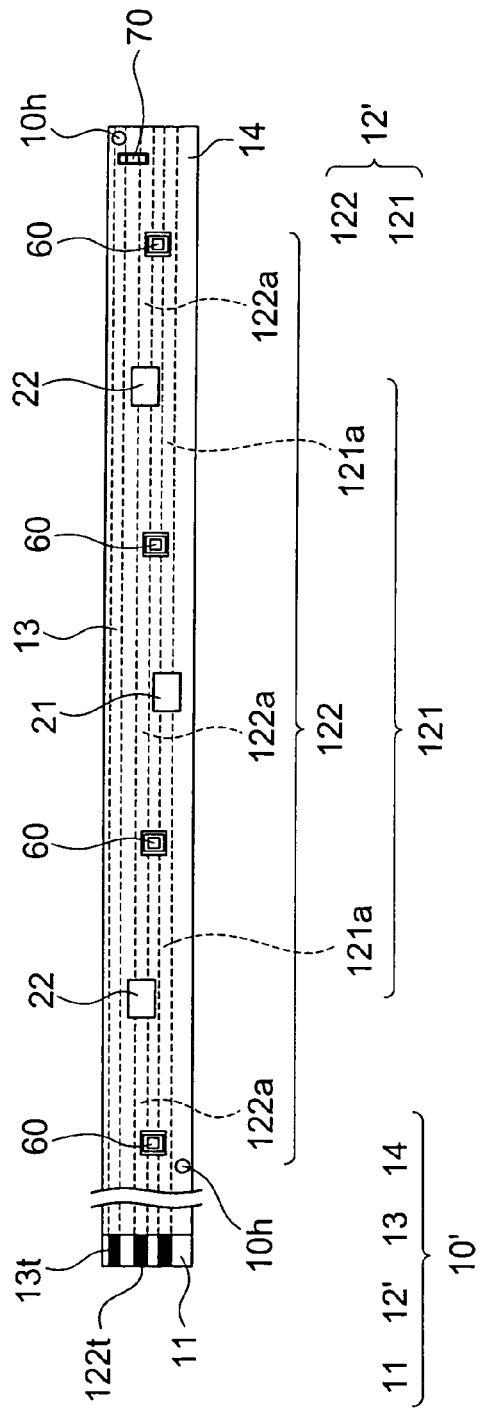
FIG. 2C is a plan view of a light emitting apparatus comprising light emitting elements mounted on the wiring board.
Figure 2D:
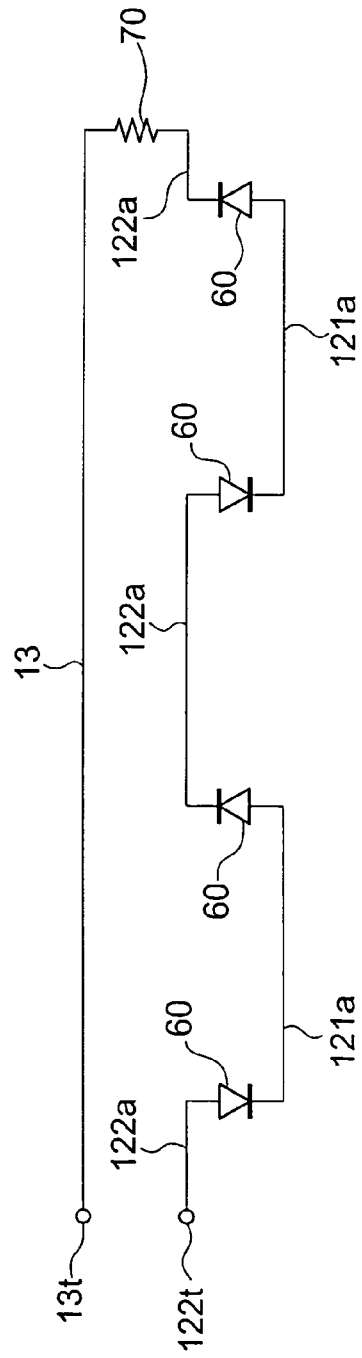
FIG. 2D is an equivalent circuit diagram of the light emitting apparatus.
Figure 3:
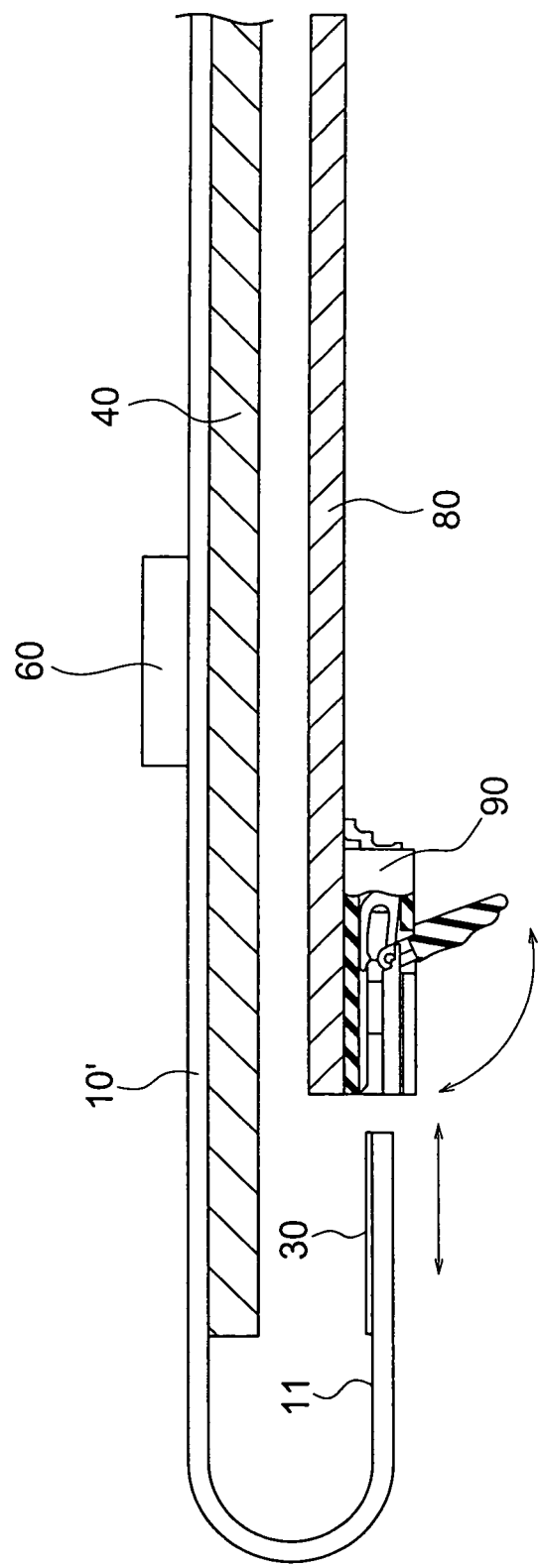
FIG. 3 is a view showing an example of use of the light emitting apparatus shown in FIG. 2C.

In order to reinforce a pair of a power feeding land 122t for the power supply line and the power feeding land 13t for the ground line, as is clear from FIG. 3, an end reinforcing plate 30 is attached to a rear surface of the insulating base film 11a at the other end of an FFC 10' (not shown in FIGS. 2A to 2D). With this structure, the other end of the FFC 10' functions as a power feeding lead which is inserted into and pulled out from an FFC connector 90. In order to insert into and pull out from the FFC connector 90 with low friction, the end reinforcing plate 30 has a surface with a low friction coefficient. Specifically, the end reinforcing plate 30 is formed of a fluorine-based resin or the like. The FFC connector 90 is mounted on a power supply substrate 80 provided with the LED driving circuit (power supply circuit).

The wiring board has, as a reinforcing frame for reinforcing the FFC 10', a backframe for the light emitting apparatus. As is clear from FIG. 3, the backframe 40 is attached to the rear surface of the insulating base film 11 in a region at least including those positions where the LED chips 60 are to be mounted. The backframe 40 is fixed to the FFC 10' by screw engagement using screws (not shown) inserted through screw holes 10h (FIGS. 2A and 2C). The screw holes 10h are formed, for example, simultaneously with a process of forming the through-hole portions 21 and 22 in the FFC 10'.

In the present invention, a method of fixing the backframe is not limited to screw engagement. Further, the number of fixing positions is not limited to two although the two screw holes 10h are shown in the figure.

In the present embodiment, the through-hole portions 21 and 22 are formed by punching using a press but may be formed by laser machining or the like. Furthermore, the through-hole portions 21 and 22 may not penetrate through the insulating base film 11. In other words, it is only necessary to segment the conductive pattern so as to form the conductive pattern segments 121a and 122a.

Third Embodiment

With light emission, the light emitting element generates heat to become a high temperature. A third embodiment of the present invention is different from the second embodiment in that heat dissipation or radiation of the light emitting element is promoted. Accordingly, for components identical or similar to those in the second embodiment, the drawings of the second embodiment will be referred to. Such identical or similar components are designated by same or like reference numerals in the figure and detailed description thereof will be omitted.

Figure 4A:
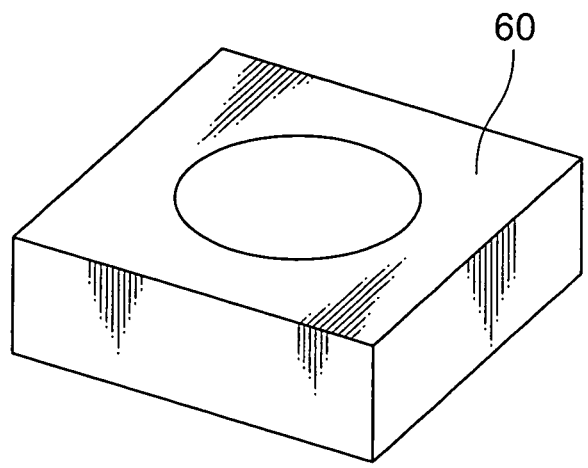
FIG. 4A is a top perspective view of a light emitting element to which a wiring board according to a third embodiment of the present invention is applied.
Figure 4B:
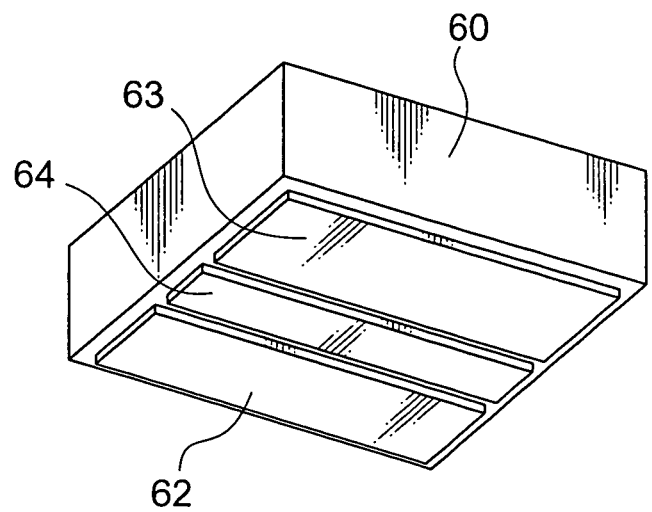
FIG. 4B is a bottom perspective view of the light emitting element illustrated in FIG. 4A.

Referring to FIGS. 4A and 4B, the LED chip 60 to be connected by a wiring board according to the third embodiment of the present invention comprises an anode terminal 62, a cathode terminal 63, and a heat-dissipating metal member 64. The anode terminal 62 and the cathode terminal 63 are a pair of power feeding terminals formed on a bottom surface of the LED chip 60. The heat-dissipating metal member 64 is formed between the anode terminal 62 and the cathode terminal 63.

Figure 4C:
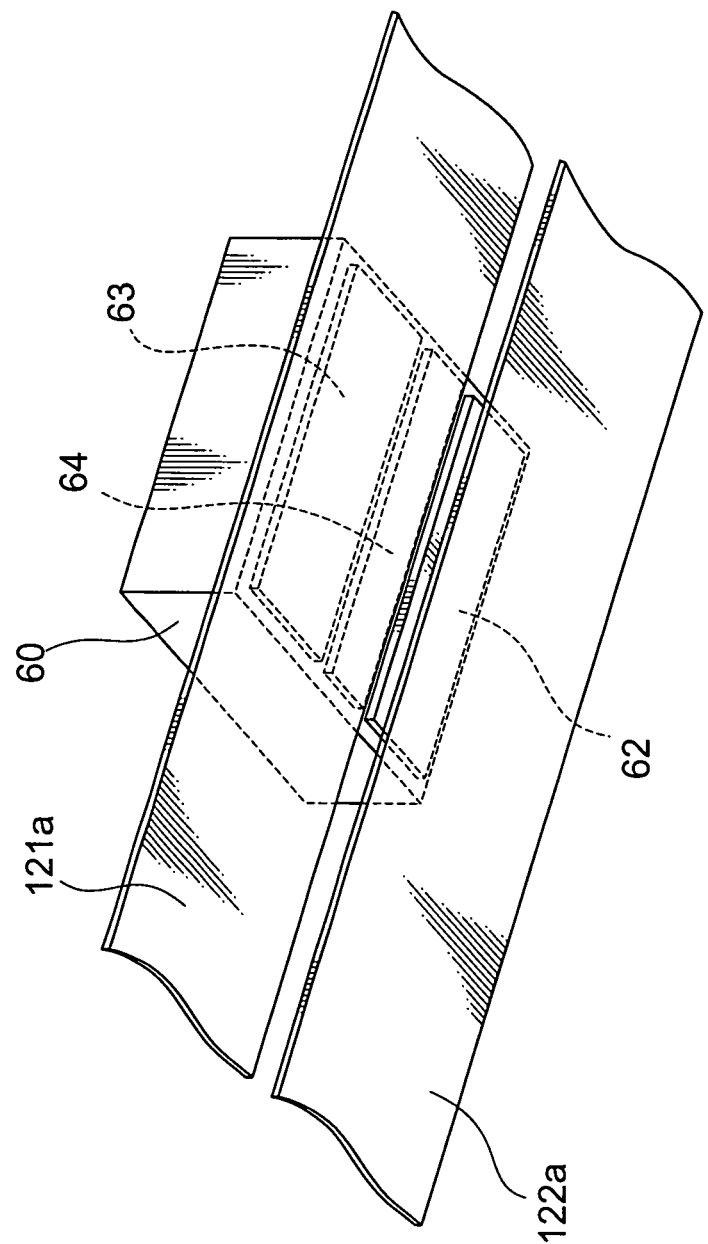
FIG. 4C is an enlarged bottom perspective view showing a characteristic part for describing how to use the wiring board.

Referring to FIG. 4C, in the wiring board according to the third embodiment of the present invention, the conductive pattern segment 121a is joined by soldering to the cathode terminal 63 and also to the heat-dissipating metal member 64.

The heat-dissipating metal member 64 may be connected, together with the anode terminal 62, to the conductive pattern segment 122a. With this structure, heat generated from the LED chip 60 is dissipated or radiated via heat conduction from the heat-dissipating metal member 64 to the conductive pattern segment 121a or the conductive pattern segment 122a. Thus, a heat dissipation effect of the LED chip 60 is enhanced.

Although the present invention has thus far been described in connection with the several embodiments, the present invention is not limited thereto. It is readily understood that the present invention may be modified in various manners within the scope of the present invention which are set forth in the appended claims. For example, the present invention is applicable to the backlight of the LCD, or the like.

In the foregoing embodiments, the FFC is formed by adhering the insulating base film and the insulating cover film to each other with the conductive pattern sandwiched therebetween. However, in the present invention, the FFC may be formed by using only one of the insulating base film and the insulating cover film and disposing the conductive pattern inside the film. Alternatively, between the insulating base film and the insulating cover film, an adhesive layer or a pressure-sensitive adhesive layer may be arranged and the conductive pattern is disposed inside the adhesive layer or the pressure-sensitive adhesive layer.

What is claimed is:

1. A wiring board electrically connecting a plurality of light emitting elements to one another, the wiring board comprising:
   an FFC provided with an insulating base film and a conductive pattern formed on the insulating base film; and
   a segmenting portion segmenting the conductive pattern of the FFC into a plurality of conductive pattern segments, the conductive pattern segments connecting the light emitting elements to thereby connect the light emitting elements in series to one another;
   wherein the FFC further comprises a second conductive pattern formed in parallel with the conductive pattern as a first conductive pattern;
   wherein the first and the second conductive patterns are connected to each other by a conductive member at one end of the FFC, so that the first and the second conductive patterns at the other end of the FFC function as a pair of power feeding lands which supply a power to the light emitting elements connected in series to one another;
   wherein the wiring board further comprises an end reinforcing plate which has a plate shape, which is attached to a rear surface of the insulating base film at the other end of the FFC and which reinforces the power feeding lands; and
   wherein the other end of the FFC functions as a power feeding lead which is inserted into and pulled out from an FFC connector.

2. The wiring board as claimed in claim 1, wherein the conductive pattern includes a pair of a first pattern element and a second pattern element extending in parallel with each other,
   each of the first and the second pattern elements having one or more segmenting portions, the segmenting portions on the first pattern element and the second pattern element being alternately arranged,
   each of the conductive pattern segments of the first pattern element and each of the conductive pattern segments of the second pattern element alternately connecting the light emitting elements to thereby connect the light emitting elements in series to one another.

3. The wiring board as claimed in claim 1, wherein the FFC further comprises an insulating cover film faced to the insulating base film with the conductive pattern sandwiched therebetween,
   the segmenting portion being formed in the conductive pattern and in at least one of the insulating base film and the insulating cover film,
   the insulating cover film having cutout portions formed in correspondence to positions where the conductive pattern and the light emitting elements are to be electrically connected to each other, so that the conductive patterns are exposed at the positions.

4. The wiring board as claimed in claim 2, wherein:
   each of the light emitting elements has a pair of power feeding terminals formed on a bottom surface thereof and a heat-dissipating metal member formed between the power feeding terminals,
   the conductive pattern segments of the first pattern element or the conductive pattern segments of the second pattern element are joined by soldering to one of the power feeding terminals and to the heat-dissipating metal member.

5. The wiring board as claimed in claim 1, further comprising a reinforcing frame which is attached to a rear surface of the insulating base film of the FFC in a region at least including positions where the light emitting elements are to be mounted, and which reinforces the FFC.

6. The wiring board as claimed in claim 3, wherein at least a front surface of the insulating cover film reflects light emitted from the light emitting elements.

7. The wiring board as claimed in claim 1, wherein the insulating base film transmits laser light for laser welding.

8. A light emitting apparatus comprising the wiring board claimed in claim 1 and the light emitting elements connected in series to one another by the wiring board.

9. The light emitting apparatus as claimed in claim 8, comprising a plurality of the wiring boards arranged in parallel to one another and the light emitting elements connected in series to one another by each of the wiring boards.

* * * * *